United States Patent
Shahrokhvand et al.

(10) Patent No.: US 12,202,285 B2
(45) Date of Patent: Jan. 21, 2025

(54) HIGH DIMENSIONAL FLEXIBLE STAMP WITH TILED STRENGTHENED AREA

(71) Applicant: Morphotonics Holding B.V., Veldhoven (NL)

(72) Inventors: Maryam Shahrokhvand, Eindhoven (NL); Bram Johannes Titulaer, Veldhoven (NL); Jan Matthijs Ter Meulen, Eindhoven (NL)

(73) Assignee: MORPHOTONICS HOLDING B.V., Veldhoven (NL)

( * ) Notice: Subject to any disclaimer, the term of this patent is extended or adjusted under 35 U.S.C. 154(b) by 0 days.

(21) Appl. No.: 18/006,706

(22) PCT Filed: Jul. 6, 2021

(86) PCT No.: PCT/EP2021/068662
§ 371 (c)(1),
(2) Date: Jan. 24, 2023

(87) PCT Pub. No.: WO2022/022951
PCT Pub. Date: Feb. 3, 2022

(65) Prior Publication Data
US 2023/0347672 A1    Nov. 2, 2023

(30) Foreign Application Priority Data
Jul. 31, 2020  (EP) ..................................... 20188861

(51) Int. Cl.
*B41K 1/38*     (2006.01)
*G03F 7/00*     (2006.01)

(52) U.S. Cl.
CPC .............. *B41K 1/38* (2013.01); *G03F 7/0002* (2013.01)

(58) Field of Classification Search
None
See application file for complete search history.

(56) References Cited

U.S. PATENT DOCUMENTS

2017/0203471 A1    7/2017  Obata

FOREIGN PATENT DOCUMENTS

| EP | 3370250 A1 | 9/2018 | |
| WO | 2016128494 A1 | 8/2016 | |
| WO | WO-2020074709 A1 * | 4/2020 | ........... G03F 7/0002 |

OTHER PUBLICATIONS

International Search Report and Written Opinion received for PCT Application No. PCT/EP2021/068662 on Feb. 3, 2022, 9 pgs.

* cited by examiner

*Primary Examiner* — Joshua D Zimmerman
(74) *Attorney, Agent, or Firm* — Merchant & Gould P.C.

(57) ABSTRACT

A flexible stamp includes at least one strengthening layer and texturing layer with a relief area. At least part of the at least one strengthening layer is positioned below the at least one texturing layer and at least partially supports the relief area and texturing layer. The combination of this part of strengthening layer, texturing layer and relief area forms an active area. The flexible stamp includes a non-active area having at least one further part of the at least one strengthening layer which does not support the texturing layer and relief area or at least one further strengthening layer. Each strengthening layer has a thermal expansion coefficient of 10 ppm/° C. or lower, a Young's modulus of 10 GPa-200 GPa, and thickness below 300 μm. The active area and the non-active area of the flexible stamp represent at least 90% of the total area of the flexible stamp.

15 Claims, 8 Drawing Sheets

HIGH DIMENSIONAL FLEXIBLE STAMP WITH TILED STRENGTHENED AREA

CROSS-REFERENCE TO RELATED APPLICATION(S)

This application is a National Stage Application of PCT/EP2021/068662, filed 6 Jul. 2021, which claims benefit of Ser. No. 20/188,861.7, filed 31 Jul. 2020 in Europe, and which applications are incorporated herein by reference. To the extent appropriate, a claim of priority is made to each of the above disclosed applications.

The invention relates to a flexible stamp having a high dimensional stability. Such flexible stamps are used for imprinting of micro- and nanostructures.

Micro and nano structures are used to enhance the performance of products. For example, this can be either the improvement of solar panels efficiency using anti-reflective structures, or the creation of an optical 3D effect for displays using micro lenses or nano gratings.

Structures can be added to products using imprint technology. There are different imprint technologies, as for instance wafer-scale UV-NIL, roll-to-roll imprinting or roll-to-plate imprinting. In each case a master structure, having the inverse structure as required on the product, is pressed upon the product with UV or thermal curable resin in between. After curing the resin is solidified and the master is removed from the product.

For the imprint technology due to the following reasons a large imprinting area is desired:

1) To have the opportunity to imprint textures on large products (i.e. solar panels or large displays).

2) To replicate multiple products in one replication cycle. Hereby the throughput is strongly increased.

Large area replication needs a large area master. The master price depends on the manufacturing time, and thereby the size of the masters. Large area masters are expensive.

A different solution is to make a large scaled-up master out of a small base master. Using a step and repeat manner, the master structure is copied multiple times in a matrix structure. In between the replicated areas there are stitch or splice lines.

As everyone can imagine, dimensional stability of the flexible stamp must be maintained for applications requiring specific and non-varying optical behavior. The prior art has different solutions for the dimensional stability of the active area of the imprint master, this is the area with the imprint patterns. For example—in EP 3370250 it is disclosed to transfer a pattern with good positional accuracy to a molding target material. This is achieved by using a glass substrate layer in contact with a resin layer. The glass substrate layer has a tensile stress of 50 MPa or lower when it is bent into a state with a curvature radius of 150 mm or smaller.

The prior art has the disadvantage that dimensional stability of the stamp outside the active area is more or less out of control. Especially for larger flexible stamp, with handling areas outside the active area, this also affects the position accuracy of the active area. The larger the flexible stamp, the more complex is to have a larger area with high dimensional stability.

In Document WO 2020/074709 for example a flexible stamp with tunable high dimensional stability is described. In this document a texturing layer is arranged under a strengthening layer, whereby the strengthening layer has a low expansion coefficient. The strengthening layer is shielded by other layers to protect the strengthening layer against any damages. Due to the use of the strengthening layer and the protection of the strengthening layer, the flexible stamp has a high dimensional stability in the area of the texturing layer.

It is therefore the purpose of the present invention to overcome or at least to reduce the disadvantages of the prior art.

The problem is solved by a flexible stamp comprising at least one strengthening layer and at least one texturing layer with a relief area, whereby at least one part of the at least one strengthening layer is positioned below the at least one texturing layer and at least partially supports the relief area and the texturing layer. The combination of this part of strengthening layer, texturing layer and relief area forms an active area of the flexible stamp. In addition, the flexible stamp comprises a non-active area which comprises at least one further part of the at least one strengthening layer which is uncovered by the texturing layer and relief area or at least one further strengthening layer which is uncovered by the texturing layer and relief area. Uncovered in this case means that the at least one further part of the at least one strengthening layer or the at least one further strengthening layer does not support the texturing layer and the relief area—the texturing layer and the relief area are not arranged above the at least one further part of the at least one strengthening layer or the at least one further strengthening layer. Each strengthening layer has a thermal expansion coefficient of 10 ppm/° C. or lower, a Young's modulus in the range of 10 GPa-200 GPa, and a layer thickness of below 300 µm. The active area and the non-active area of the flexible stamp represent at least 90% of the total area of the flexible stamp.

The problem is also solved by a flexible stamp comprising at least one strengthening layer, whereby the at least one strengthening layer has a thermal expansion coefficient of 10 ppm/° C. or lower, a Young's modulus in the range of 10 GPa-200 GPa, and a layer thickness of below 300 µm. The at least one strengthening layer covered at least 90% of the total area of the flexible stamp. In this alternative of the invention the flexible stamp can also comprise a plurality of strengthening layers, whereby at least one strengthening layer is only part of the active area and another strengthening layer is only part of the non-active area (see FIG. 1). According to this embodiment all or at least a single strengthening layer are/is present in tiled form.

For the entire application it applies that each strengthening layer may present in a tiled form. A plurality of tiled strengthening tiles can build up a strengthening layer. The dimensions of the tile and the strengthening layer depends on the size of the flexible stamp, as well as on the master layout.

For a flexible stamp in the order of 1 m to 2 m, a tile has preferably a dimension that is in the order of 100 mm×100 mm or 200 mm×200 mm.

The strengthening layer of a flexible stamp of around 1 m to 2 m has preferably a dimension (length×width) in the order of 500 mm×500 mm or 600 mm×600 mm or 400 mm×600 mm, preferably also between 1000 mm×3000 mm and 300 mm×1000 mm Between different strengthening tiles a gap is present. Also, between a plurality of strengthening layers (in untiled form) is preferably a gap present. The at least one strengthening layer and the at least one further strengthening layer are arranged in the same plane. Also, by the use of tiles (of the same or different strengthening layers) the tiles are arranged in the same plane. Different strengthening layers as well as the tiles are not stacked on top of each other.

The following explanations apply to the at least one strengthening layer and the at least one further strengthening layer even if only the term "strengthening layer" is used.

It should be noted that the flexible stamp can comprise more than one strengthening layer. Thus, also the term "strengthening layer" is used in the following even if a plurality of strengthening layers are encompassed. In addition, according to the invention it is also possible that the flexible stamp comprises one strengthening layer, whereby the strengthening layer comprises a plurality of strengthening tiles separated from each other via a gap. Also, a plurality of strengthening layers, whereby one or more strengthening layers comprise(s) a plurality of strengthening tiles are thinkable for the flexible stamp.

If a single strengthening layer is used this strengthening layer is part of the active area and part of the non-active area. If a plurality of strengthening layers are used at least one strengthening layer is part of the active area and at least another strengthening layer is part of the non-active area. However, in this embodiment it is also possible that each strengthening layer is part of the active area and part of the non-active area.

Less than 10% of the flexible stamp area is preferably uncovered by the at least one strengthening layer and/or the at least one further strengthening layer.

The strengthening layer according to this invention is made of a thermally stable material and the dimension of the at least one strengthening layer is chosen so that the strengthening layer influences the dimensional stability of the flexible stamp. Thus, the function of the strengthening layer has been expanded—the strengthening layer not only has the task to support the texturing layer but also enhances the dimensional stability of the entire flexible stamp In one embodiment, at least 95% or approximately 100% of the total area of the flexible stamp is part of the active area or the non-active area. The term "approximately" means ±5%.

Preferably, the active area represents 40%, more preferred 70% and most preferred 90% of the total area of the flexible stamp. Preferably the non-active area represents 60% more preferred 30% and most preferred 10% of the total area of the flexible stamp.

The flexible stamp according to the invention is particularly useful for the roll-to-plate imprint technology. In contrast to wafer-scale handling, in the roll-to-plate imprint technology the flexible stamp has a large non-active area for handling.

For wafer scale applications the sizes of the imprint master and active area are comparable. In the case of roll-to-plate imprint technology a larger flexible stamp is used. This flexible stamp has an additional handling area as non-active area before and after the active area. In the prior art, only the active area has one strengthening layer whereas the non-active area is free of additional layers. This has the disadvantage that the handling area is usually thermally unstable. Thus, at least parts of the flexible stamp expand or shrink if the temperature, humidity or tension changes for example within the equipment or during processing. For most applications the flexible stamp has an expansion coefficient that differs from the substrate. The substrate is in most cases a discrete and more or less rigid metal, polymer, silicon or glass plate. Varying temperatures or humidity levels therefore result in different lateral dimensions of the imprinted texture on the substrate after the imprinting process. In this case either the optical properties change, or the texture is placed at the wrong position relative to the underlying structures or patterns applied in post-processing steps. For many applications only a very limited lateral dimension variation is tolerated like few microns over 1 meter.

Due to using a thermally stable strengthening layer (the at least one strengthening layer and/or the at least one further strengthening layer) according to the invention the entire flexible stamp has a high dimensional stability and the imprinting product has an excellent quality. The thermally stable strengthening layer is also arranged in the non-active area of the flexible stamp and thus avoids dimension variations.

In one embodiment the at least one strengthening layer and/or the at least one further strengthening layer is arranged on and in contact with a base layer of the flexible stamp, whereby at least 90% of the base layer area (preferably at least 95% and more preferred approximately 100% of the base layer area) is covered or is in contact by or with the at least one strengthening layer and/or the at least one further strengthening layer. Also, here the term "approximately" means ±5% and in contact means that the at least one strengthening layer and/or the at least one further strengthening layer lies on the base layer, possibly with an intermediate adhesive layer in between. In one embodiment the at least one strengthening layer and/or the at least one further strengthening layer is positioned below the base layer and the base layer lies on the at least one strengthening layer and/or the at least one further strengthening layer (with or without a further adhesive layer in-between). In one embodiment a plurality of strengthening layers or a plurality of tiles of one strengthening layer are arranged on the base layer in one plane in such a way that the gaps or seams between different strengthening layers or between different strengthening tiles are as small as possible. These gaps are much smaller than the entire size of the flexible stamp and thus, do not impact its dimensional stability. The gap between different strengthening layers arranged next to each other or between different neighboring tiles or between a strengthening layer and strengthening tiles is preferably below 1 cm, more preferred below 2 mm and most preferred below 500 μm.

Using a plurality of strengthening layers or at least one strengthening layer divided into a plurality of strengthening tiles, offers the advantage of dividing the base layer into multiple dimensionally stable areas as well as it provides the opportunity to divide the active area (strengthening layer in combination with texturing layer and relief area) in multiple smaller areas. A small gap or seam in between the plurality of strengthening tiles will only have a minimal impact on the position accuracy deviation, while the ease of making a large flexible stamp with high dimensional stability is increased.

As the effect of a varying lateral dimension is prominent with a varying temperature, this invention focuses on thermal expansion. A varying humidity has similar effects. And also strain or tension deform the flexible stamp. In the context of this description, where thermal expansion is mentioned, also humidity expansion or expansion by tension can be read and is meant as well as, shrinkage can be read as a form of negative expansion.

In one embodiment of the invention the flexible stamp comprises two or more strengthening tiles. Each of the strengthening tiles may have parts of the texturing layer on top, and are either placed aside or in a row. Hereby the manufacturing of the large flexible stamp with high dimensional stability is made easier.

In one embodiment less than 90%, or less than 80% of the surface area of the at least one strengthening layer supports the texturing layer and the relief area. This means that more than 10%, or more than 20% of the surface area of the strengthening layer is part of the non-active area—this means above the surface area of the strengthening layer no texturing layer and relief area is present. The strengthening layer is in in contact with the base layer-preferably lies on the base layer (with or without a further layer in-between) or the base layer lies on the strengthening layer (with or without a further layer in-between). If a plurality of strengthening tiles is used, the surface areas of individual strengthening tiles are added together to form the surface area of the strengthening layer. If more than one strengthening layer is used also here the minimum sum of the surface area results from the combinations of individual strengthening surface areas. Due to the fact that 90% of the total area of the flexible stamp is covered by the at least one strengthening layer (in tiled form or not), a thermally unstable material can be used as the base layer. This reduces the costs of the flexible stamp.

In one embodiment at least 70%, more preferred at least 80% and most preferred at least 90% of the base layer area is in contact with the at least one strengthening layer and/or the at least one further strengthening layer. Preferably the at least one strengthening layer and/or the at least one further strengthening layer lies on at least 70%, more preferred on at least 80% and most preferred on at least 90% of the base layer area (with or without a further layer in between). In one further preferred embodiment, at least 70%, more preferred at least 80% and most preferred at least 90% of the base layer area lies on the at least one strengthening layer and/or the at least one further strengthening layer (with or without a further layer in between). In one embodiment the entire surface area of the base layer is in contact with the at least one strengthening layer and/or the at least one further strengthening layer.

The term "in contact" means that the strengthening layer overlays the base layer, when the strengthening layer is arranged above the base layer (based on the texturing layer). The term "in contact" also means that the strengthening layer supports the base layer, when the strengthening layer is arranged below the base layer (based on the texturing layer). If no further layer is between the base layer and the strengthening layer the contact is a direct contact. In any case there is a contact between the strengthening layer and the base layer, so that thermal expansion of the base layer is avoided by the strengthening layer.

In one embodiment of the invention the flexible stamp comprises a plurality of strengthening tiles. A plurality of strengthening tiles means at least 2, or at least 3, or at least 4 or at least 5 strengthening tiles. The plurality of strengthening tiles is preferably positioned on and in contact with the base layer, whereby the strengthening tiles have a gap between each other. In one further embodiment the base layer is positioned on and in contact with the plurality of strengthening tiles. In both embodiments between the plurality of strengthening tiles and the base layer a further layer (for example an adhesive layer) may be present. The plurality of strengthening tiles may be part of the at least one strengthening layer and/or part of the at least one further strengthening layer. In fact, parts of the base layer without a stabilization tile have a low dimensional stability. This means, the gap area may expand or shrink depending on the environmental conditions. The parts of the base layer covered by the strengthening tiles have a high overall dimensional stability due to the dimensional stability of the strengthening tiles (with the features according to the invention). However, the gap area within the flexible stamp is small in comparison to the area covered by the strengthening tiles and thus, the entire flexible stamp achieves a high dimensional stability.

In one embodiment the at least one strengthening layer and/or the at least one further strengthening layer has/have a width below 1.3 m and a length below 2.5 m. If a plurality of strengthening tiles is used, different strengthening tiles can have the same or different dimensions (length, width, thickness).

Strengthening tiles preferably have the length of the onset area and the width of the flexible stamp, or a number of even parts, for example ½, ⅓ or ¼, of the length and/or width of the onset area. The onset area is the area of the flexible stamp from which imprinting process starts. Regarding the onset area reference is made to international application PCT/EP2016/052873.

In a further embodiment of the invention the flexible stamp comprises a top layer, whereby the top layer is positioned at least partially above the at least one strengthening layer (see FIG. 3) and/or the at least one further strengthening layer (starting from the texturing layer). In one embodiment of the invention the top layer has same material as the texturing layer. Hereby at least parts of the top layer can include the relief area (see FIG. 5a, left side). In another embodiment the top layer is a combination of different materials, for instance having partly a protective foil and partly the same material as the texturing layer. In one further embodiment of the invention the flexible stamp comprises a plurality of top layers (for example the texturing layer is tiled, see FIG. 4, right side). In one embodiment of this embodiment the texturing layer is located in the same area with the pluralities of top layers (see FIG. 4, right side) or the top layers and the texturing layer extend over different levels within the flexible stamp (see FIG. 5a, right side). In each embodiment a further layer (for example an adhesive layer) may be present between the strengthening layer and top layer.

In the embodiment in which a plurality of texturing layers is part of the flexible stamp, preferably each texturing layer has a relief pattern, which is the inverse structure of the imprinting texture on a substrate. The plurality of texturing layers may have the same or different relief patterns. In addition, also the dimension (length, width and thickness) of the texturing layers can be the same or different. Preferably, the dimension of the strengthening layer is greater than the dimension of the texturing layer, so that the relief pattern is completely supported by the strengthening layer.

In one embodiment the base layer is overlaid by multiple strengthening layers, whereby at least one texturing layer is positioned in the middle of the multiple strengthening layers (see FIG. 2). In one other embodiment the base layer is overlaid by a plurality of strengthening tiles, whereby the at least one texturing layer is positioned in the middle of a plurality of strengthening tiles (see FIG. 1).

In one embodiment the base layer has a frame area, which is not part of the active area and the non-active area. The frame area is formed by less than 100%, preferably less than 10%, of the base layer area not being in contact with the at least one strengthening layer and/or the at least one further strengthening layer. This means, the frame area is an area within the base layer which is free of any strengthening layer or strengthening tiles. Preferably, the frame area is located in an edge area of the base layer. In this edge area clamps can be mounted. A front clamp can be mounted on one side of the base layer in the frame area and a back clamp is positioned at another side of the base layer in the frame area.

Due to the clamps the flexible stamp is held in place and the flexible stamp is moveable (see FIG. 6).

In another embodiment the flexible stamp comprises an external frame area. In this embodiment the external frame area is mounted additionally on a flexible stamp with either a plurality of strengthening layers and/or a plurality of strengthening tiles. By mounting the external frame area additionally on a present flexible stamp, without or with frame area, clamping of the flexible stamp without damaging the strengthening layer is enabled. The mounting can be done by gluing, taping or nailing the external frame area to one or both outer ends (base layer with or without any strengthening layer) of the flexible stamp. Moreover, this increases the design options for the flexible stamp since no frame area within the flexible stamp has to be taken into account. In addition, by varying the external frame area, the same flexible stamp can be adapted to different clamps or imprinting apparatus (with different rollers).

In one embodiment the top layer and/or the base layer are/is a foil. The foil is characterized by the fact that it has a thickness of below 500 µm and is foldable. Preferably the foils are made of the same or different materials and/or have the same or different material properties. Also, the dimension (length, width and thickness) of the foils (top layer and base layer) may be the same or differ from each other. The use of a foil has the advantage that it protects the at least one strengthening layer and/or the at least one further strengthening layer. In addition, by using foil the flexible stamp is more flexible and at least parts of the flexible stamp are foldable. In one embodiment the top layer is made of a cured resin. In this embodiment the resin is characterized by the fact that it is UV or thermal curable and has a viscosity lower than 10000 mPas at room temperature. The cured resin can have a relief pattern, which forms the relief area. The use of resin has the advantage that it protects the strengthening layer. In addition, the resin can be applied easily and precisely and is adaptable to different formats.

In one embodiment the top layer and/or the base layer have a thickness between 25 to 500 µm, preferably between 30 to 300 µm or more preferably between 100 to 250 µm.

In one embodiment the top layer has parts with a relief pattern, which is the inverse structure of the imprinting texture on a substrate. This means that parts of the top layer can be the texturing layer. Parts of the top layer without imprinting texture (texturing free parts) should not be assigned to the texturing layer. Such parts of the top layer can be arranged above the at least one strengthening layer and/or the at least one further strengthening layer.

According to the invention the at least one strengthening layer and the at least one further strengthening layer has a thermal expansion coefficient of 10 ppm/° C. or lower, a Young's modulus in the range of 10 GPa-200 GPa, and a layer thickness of below 300 µm. The at least one strengthening layer has at least one area which supports a relief area of the at least one texturing layer. In one embodiment the at least one strengthening layer and/or the at least one further strengthening layer is divided into strengthening tiles. It should be noted that each strengthening tile has a thermal expansion coefficient of 10 ppm/° C. or lower, a Young's modulus in the range of 10 GPa-200 GPa and a layer thickness of below 300 µm. The use of more than one strengthening layer, whereby each or a single strengthening layer is divided into strengthening tiles is also part of this invention. The flexible stamp advantageously has several different layers, as a result of which, for example, the thermal behavior of the flexible stamp can well be predetermined.

In a further embodiment the at least one strengthening layer and/or the at least one further strengthening layer is at least partially shielded by at least one layer selected from a group consisting of the at least one texturing layer, the base layer and one or more further layers. For example, parts of the strengthening layer (the at least one strengthening layer and/or the at least one further strengthening layer) can be embedded in the texturing layer such that corner and/or edge portions of the strengthening layer are at least partially shielded (see FIG. 5*a*). If the at least one further strengthening layer is shielded by the texturing layer, the texturing layer is relief area free and thus, only the top layer. For shielding the corner and/or edge portions of the strengthening layer, the strengthening layer can also be embedded in the base layer. In addition, as a further layer an adhesion layer can be used and shields at least partially the strengthening layer (see FIG. 3, left side). In an embodiment, at least one corner portion, preferably at least two corner portions, more preferably at least three corner portions, even more preferably at least four corner portions, and most preferably all corner portions of the one or more strengthening layer(s) are shielded at least partially by the at least one layer. In a further embodiment, at least one edge portion, preferably at least two edge portions, more preferably at least three edge portions, even more preferably at least four edge portions, and most preferably all edge portions of the strengthening layer are shielded at least partially by the at least one layer. It is also possible that the number of shielded corner portions and edge portions are the same or different. Preferably, all corner portions and edge portions of the strengthening layer are shielded at least partially. By shielding at least partially the corner and/or the edge portions of the strengthening layer, it is believed that the proneness of breaking the strengthening layer is eliminated or at least reduced, such that the strengthened flexible stamp is able to be used repeatedly. In one embodiment, the at least one layer shielding the corner and/or edge portions of the strengthening layers shields at least partially the first main surface and the second main surface. Preferably, the at least one layer shielding at least partially the first main surface and the at least one layer shielding at least partially the second main surface are separate layers. In this respect reference is made to international application WO 2020/074709, whereby at least FIG. 2 and page 13-15 is incorporated herein by reference.

In the embodiment in which the at least one strengthening layer and/or the at least one further strengthening layer is divided into strengthening tiles also one or more or all strengthening tiles can be shielded by at least one layer selected from a group consisting of the at least one texturing layer, the base layer and one or more further layers. Regarding the different options for the shielding and the shielded portion of the strengthening tiles the same applies as in the previous part described for the shielding of the at least one strengthening layer.

In one embodiment the flexible stamp comprises a plurality of strengthening layers and texturing layers (comprising the relief area). The texturing layers are arranged above and preferably in contact with the strengthening layers. Each texturing layer in combination with a strengthening layer forms a master unit. Different master units are arranged like tiles in the active area (and built up the active area).

Adjoining edges of neighboring master units are parallel to each other and the master units forming the active area are arranged such that splice lines between the master units only have junctions between master units where at most three corners of neighboring master units are brought together.

Misalignment of the master units and rotated tiles can be reduced or even avoided, if the master units are assembled such that the splice lines between the assembled master units only have junctions between master units where at most three corners of neighboring master units are brought together, i.e. only have junctions where vertices of at most three master units meet. In this respect reference is made to unpublished European patent application EP 19202151.7.

In a further embodiment the master units are arranged in rows perpendicularly to the length direction of the active area within the active area, wherein the master units of one row show an offset from the master units of the neighboring rows.

The invention further pertains to an imprinting apparatus for a flexible stamp according the above description. The imprinting apparatus comprises rollers which transport the flexible stamp via clamps. The rollers have the same radius r. As described above the flexible stamp has a frame area, in which no strengthening layer is positioned and where the clamps can be attached to the flexible stamp for transporting. To ensure that the flexible stamp is transported smoothly without jerking and with a constant speed, the dimension of the flexible stamp and the rollers must match to each other. Otherwise the clamps get in contact with one or more rollers and imprinting process is influenced by friction between both parts of the apparatus. A first length E starts from the beginning of a (first) active area in opposite direction of the imprint direction and ends on a first clamp (front clamp). A second length F of the frame area starts at the end of a (last) active area in imprint direction and ends at a second clamp (back clamp) in imprinting direction. In one embodiment the first length E and the second length F are equal. The minimal lengths of E and F must satisfy the following formula:

$$L = \frac{1}{4} 2 * \pi * r$$

whereby

L is the first length E or the second length F, r is the radius of the rollers.

If the length E and length F are shorter, the pressure during imprinting of the active area might not be uniform.

The invention is explained now in more detail with reference to the following figures, wherein the scope of the invention is not limited by the figures:

FIG. 2 shows schematically two versions of the flexible stamp whereby in each version two strengthening tiles are used and an-active area is in between.

Figure 1:
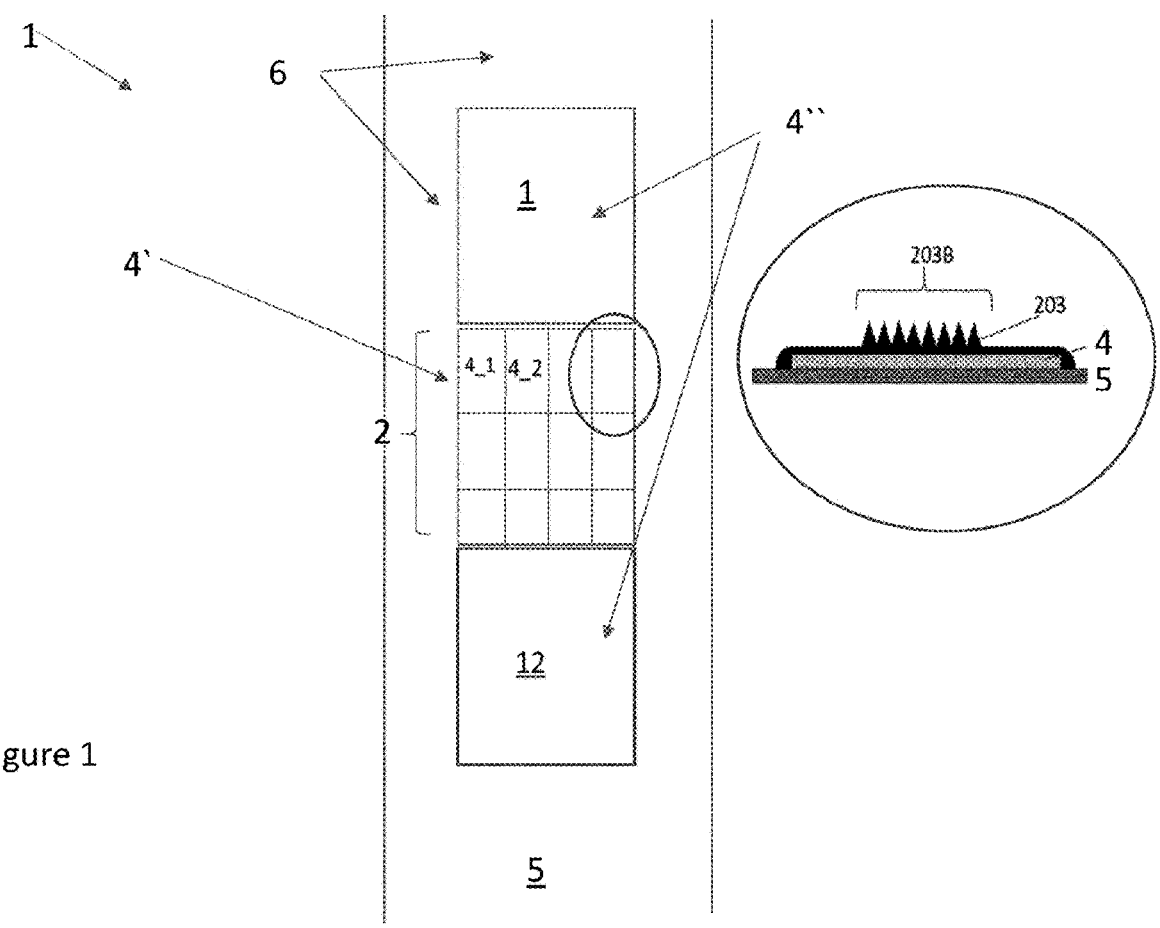
FIG. 1 shows schematically a flexible stamp comprising a tiled strengthening layer and further strengthening layers.

In FIG. 1 a flexible stamp 1 in a top-view perspective is shown. The flexible stamp comprises at least one active area 2 and—in the embodiment according to FIG. 1—three strengthening layers 4', 4". The strengthening layers 4', 4" are arranged in contact with a base layer 5. Not shown in the figure is a further layer between the strengthening layers 4', 4" and the base layer 5. This further layer is preferably an adhesive layer. The active area 2 comprises a plurality of strengthening tiles 4_1, 4_2 (part of the strengthening layer 4) and a plurality of texturing layers above the strengthening tiles 4_1, 4_2. On the right side of FIG. 1 an enlarged side-view of the active area 2 in a circle is shown in details. The strengthening tile is arranged on the base layer 5 and a texturing layer 203 comprising a relief area 203B is positioned above the strengthening tile 4. Thus, the texturing layer 203 is supported by the strengthening tile 4. In this embodiment the texturing layer 203 shields the strengthening tile 4. The relief area 203B can be the same or different for different texturing layers 203. As can be seen in FIG. 1, two further strengthening layers 4" are outside of the active area 2 and are not covered by the texturing layer 203. The two further strengthening layers 4" are part of a non-active area 12 and in principle texturing layer free. In addition, a frame area 6 on the base layer 5 is free of any strengthening layer 4' and 4" and thus is not part of the active area 2 and the non-active area 12. Not shown but it is also possible that the strengthening tiles extend over the entire base layer 5. According to this embodiment no frame area 6 is present on the flexible stamp 1. In addition, in one embodiment the frame area 6 is only presented in front of the strengthening layer 4' and 4" and/or behind the strengthening layers (or tiles) 4 and 4" in imprint direction but the strengthening layer 4 and 4" extend to the side edges of the base layer 5.

Figure 2:
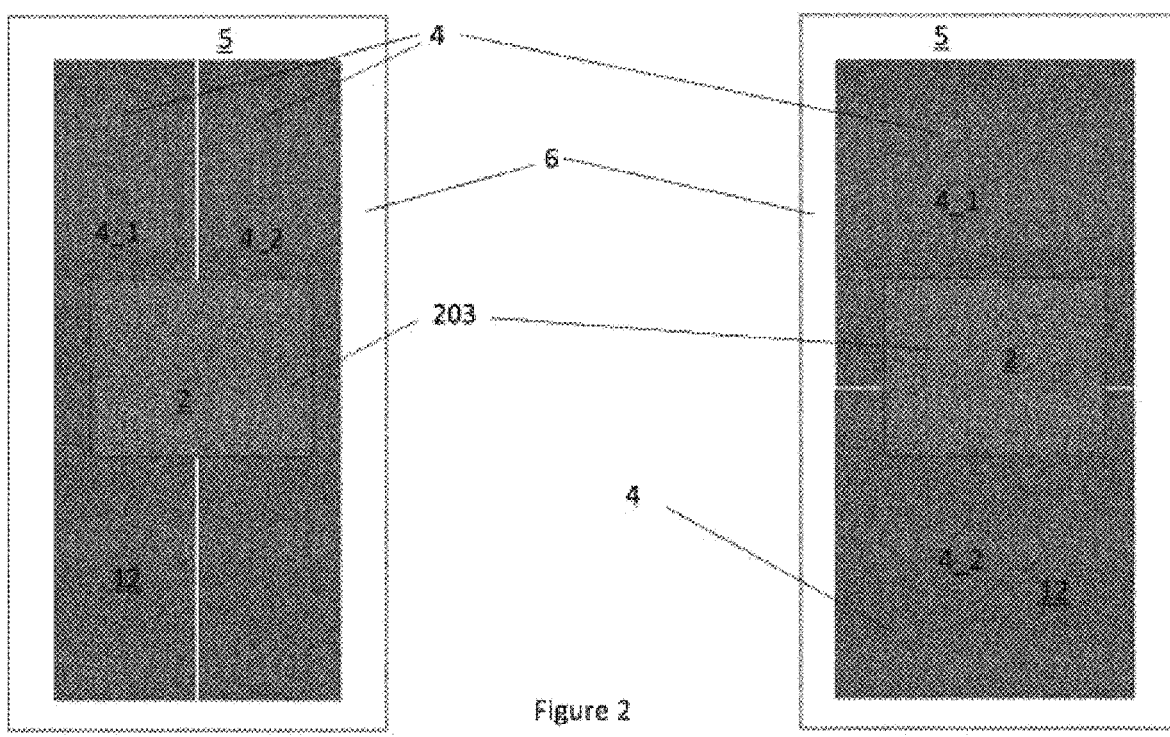

In FIG. 2 two different embodiments of a flexible stamps 1 in top-view perspective are shown. In both embodiments the flexible stamp 2 comprises two strengthening tiles 4_1 and 4_2 and in between a texturing layer 203. The base layer 5 is in both embodiments almost completely covered by the strengthening tiles 4_1 and 4_2. This means the strengthening tiles 4_1 and 4_2 overlay almost the complete base layer area 5. Only a frame area 6 of the base layer 5 is free of any strengthening layer 4. The strengthening tiles 4_1 and 4_2 are part of the active area 2 as well as parts of the non-active area 12. The non-active area 12 is built by the parts of the strengthening tiles 4_1 and 4_2 which are not covered by the texturing layer 203.

Figure 3:
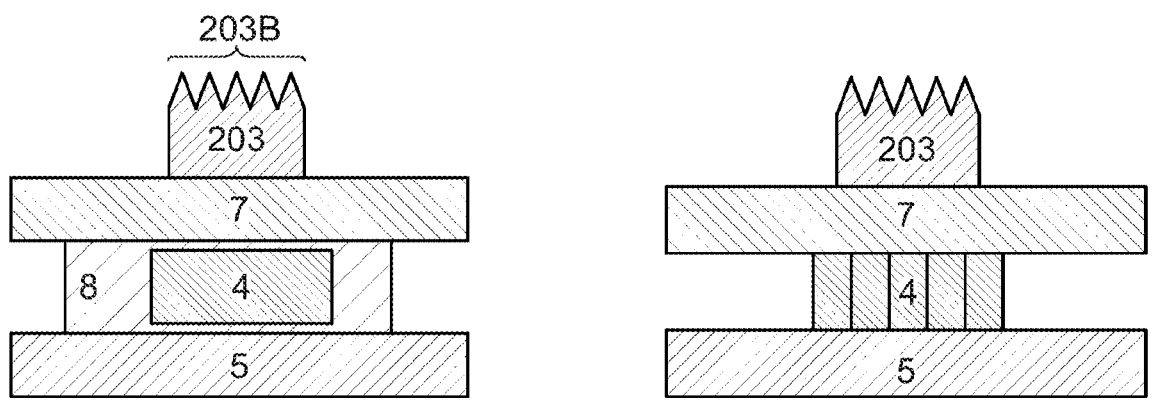
FIG. 3 shows schematically two different versions of the flexible stamp. In a first version an additional layer shields the strengthening layer and in a second version the strengthening layer is tiled.

In FIG. 3 two different embodiments of a flexible stamp 1 in side-view perspective are shown. In a first embodiment on the left side of FIG. 3 the strengthening layer 4 is shielded by an additional layer 8. The texturing layer 203 comprises a relief area 203B and is positioned on top of a top layer 7. The additional layer 8 and the strengthening layer 4 are above a base layer 5. Base layer 5 and top layer 7 have the same size in this embodiment.

On the right side of FIG. 3 the flexible stamp 1 comprises a plurality of strengthening tiles, which forms a strengthening layer 4. The texturing layer 203 is positioned above the strengthening layer 4 with a top layer 7 in between.

Figure 4:
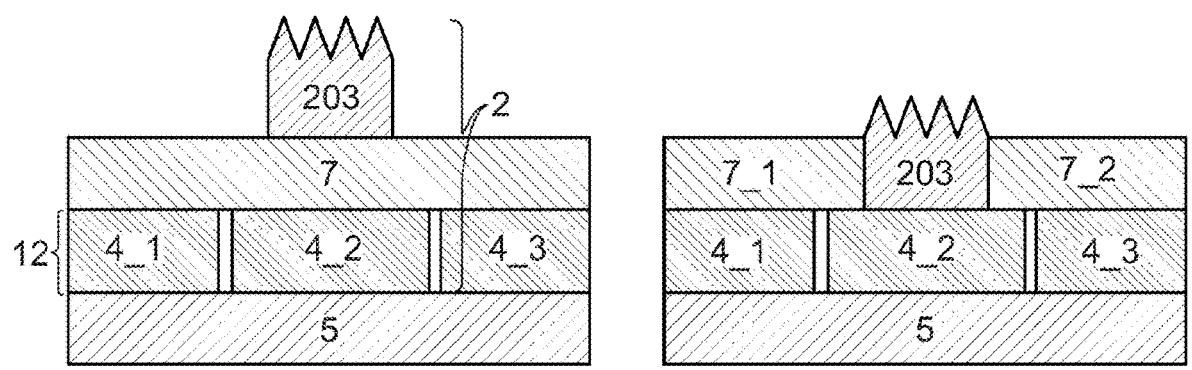
FIG. 4 shows schematically two different versions of the flexible stamp with tiled strengthening layer.

In FIG. 4 two different embodiments of a flexible stamp 1 in side-view perspective are shown. On the left side the flexible stamp 1 comprises a plurality of strengthening tiles 4_1, 4_2, 4_3 which form the strengthening layer 4. The strengthening tiles 4_1, 4_2, 4_3 are positioned with a gap between each other on top of a base layer 5. On top of the strengthening tile 4_2 a texturing layer 203 is-positioned. In this embodiment the texturing layer 203 is on top of a top layer 7, which is on top of the strengthening tiles 4_1, 4_2, 4_3. The strengthening tile 4_2 in combination with the texturing layer 203 build up the active area 2. The non-active area 12 is given by the—other two strengthening tiles 4_1 and 4_3. In the right side of FIG. 4 the flexible stamp 1 comprises a plurality of strengthening tiles 4_1, 4_2, 4_3 on top of a base layer 5. In this embodiment the texturing layer 203 is part of a top layer 7 and is only located above the strengthening tile 4_2.

Figure 5A:
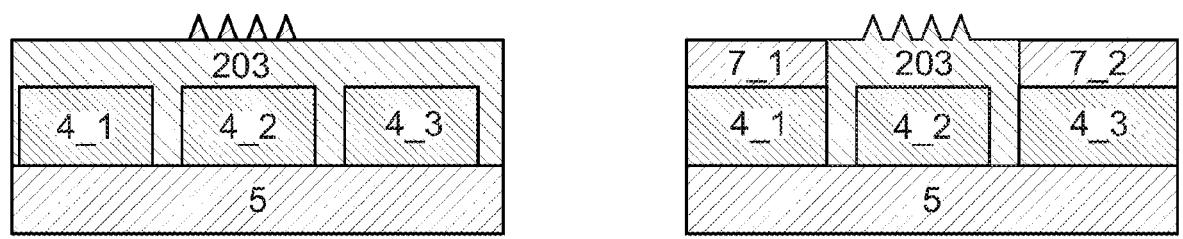
FIG. 5a shows schematically two different versions of the flexible stamp in which a texturing layer shields a strengthening tile.

In FIG. 5a two different embodiments of a flexible stamp 1 are shown. On the left side of FIG. 5 the flexible stamp 1 comprises a plurality of strengthening tiles 4_1, 4_2, 4_3 which are shielded by the texturing layer 203. In this embodiment the texturing layer is the top layer, whereby only parts of the top layer comprise the relief area.

On the right side of FIG. 5a the flexible stamp comprises strengthening tiles 4_1, 4_2, 4_3 and also a top layer 7 is divided into tiles 7_1 and 7_2. A texturing layer 203 is positioned above the strengthening tile 4_2 and shields the strengthening tile 4_2. The strengthening tiles 4_1 and 4_3 are covered by the top layer tiles 7_1 and 7_2.

Figure 5B:
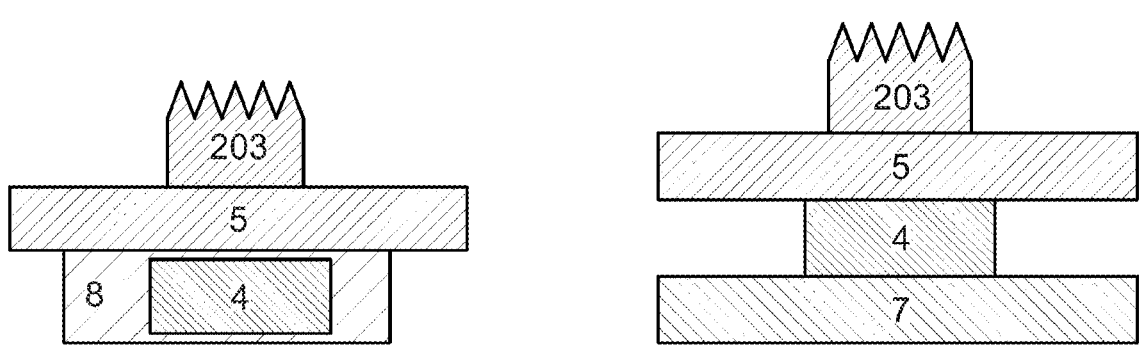
FIG. 5b shows schematically two different versions of a flexible stamp with a special position for a base layer in respect to a strengthening layer.

On the left side of FIG. 5b, the top layer 5 is arranged above the strengthening layer 4, whereby an additional layer 8 shields the strengthening layer. This additional layer 8 is for example an adhesive layer. The texturing layer 203 (with relief area) is arranged above the base layer 5, but it is supported by the strengthening layer 4. As long as the strengthening layer 4 is positioned below the texturing layer 203 the strengthening layer 4 can support the texturing layer 203. However, the strengthening layer 4 also stabilizes the base layer 5. It is not decisive whether the strengthening layer 4 is arranged above or below the base layer 5. In any case the strengthening layer 4 thermally stabilizes the base layer 5 even if a further layer is arranged between the strengthening layer 4 and the base layer 5.

On the right side of FIG. 5b the position of base layer 5 and top layer 7 is reversed.

As can be seen at least in the FIGS. 4, 5a and 5b, the function of the strengthening layer 4 is not only to support the texturing layer 203 and the relief area 203B but also to ensure the stability of the flexible stamp 1. Due to the fact that the strengthening layer 4 is positioned also outside of the relief area 203B on top of the base layer 5 (for example as strengthening tiles) or below the base layer 5 in the non-active area 12, the stability of the base layer 5 is ensured and thus, the stability of the entire flexible stamp 1 is increased. Replacing one large strengthening layer 4 with strengthening tiles 4_1, 4_2, 4_3 has the advantage that while the flexibility of the flexible stamp 1 is preserved the manufacturing cost is greatly reduced. Moreover, by using strengthening tiles 4_1, 4_2, 4_3 the thermal stability of the base layer 5 is enhanced while the flexibility of the stamp 1 is not hindered. This strengthening tile 4_1, 4_2, 4_3 is usually made of glass and thus, compared to larger sheets of thin glass the handling is easier as well as the price is lower.

Figure 6:
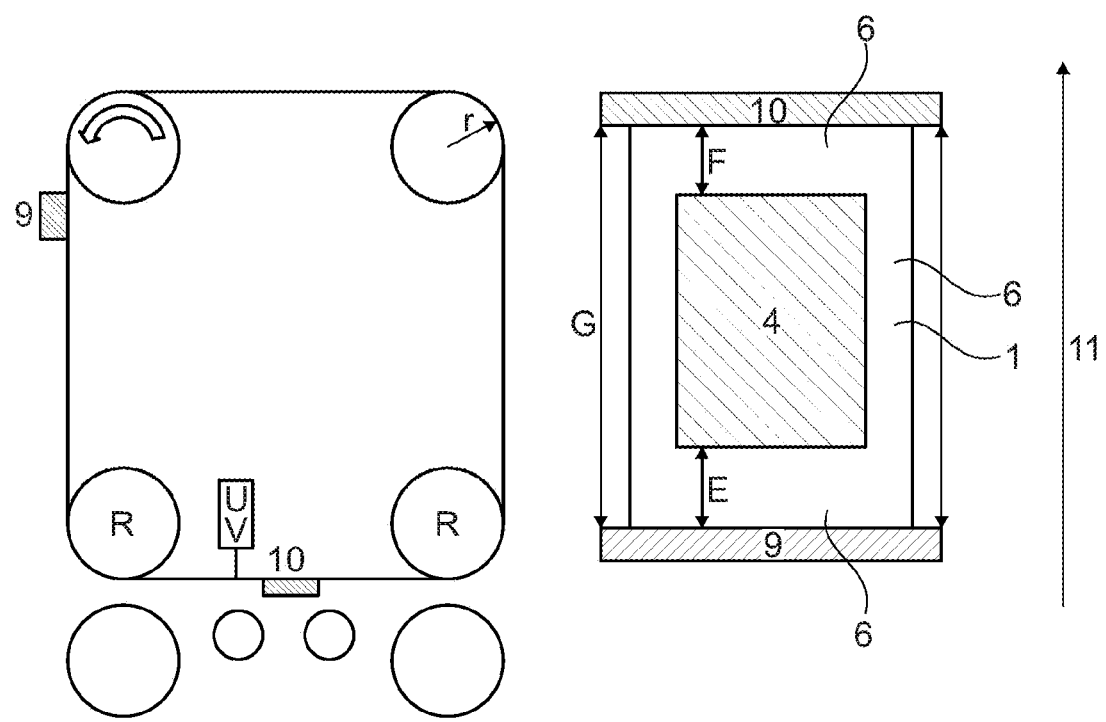
FIG. 6 shows schematically an imprinting apparatus with flexible stamp and rollers.

In FIG. 6 a schematic view (and simplified representation) of an apparatus for an imprinting process is shown. The flexible stamp 1 is transported via rollers R during the imprinting process. A front clamp 9 and a back clamp 10 are fixed in a frame area 6 of the flexible stamp 1. On the flex stamp there is an active area 2. The distance of the active area 2 to the front clamp 9, in opposite to the imprint direction 11, and to the back clamp 10, in the imprint direction 11, is the distance E and F, respectively. The entire length G of the flexible stamp 1 is given by the length of the strengthening layer 4 and the length of E and F. The Distance E or F must be adapted to the diameter of the rollers R. Otherwise the clamps 9 and 10 get in contact with one or more rollers R and the imprinting process is influenced or is no longer possible. The distance E or F must fulfill the following formula:

$$E = F = \tfrac{1}{4} \text{ circumference of the roller } R$$

$$\text{Circumference of the roller } R = 2 * \pi * r,$$

whereby r is the radius of the roller R.

Figure 7:
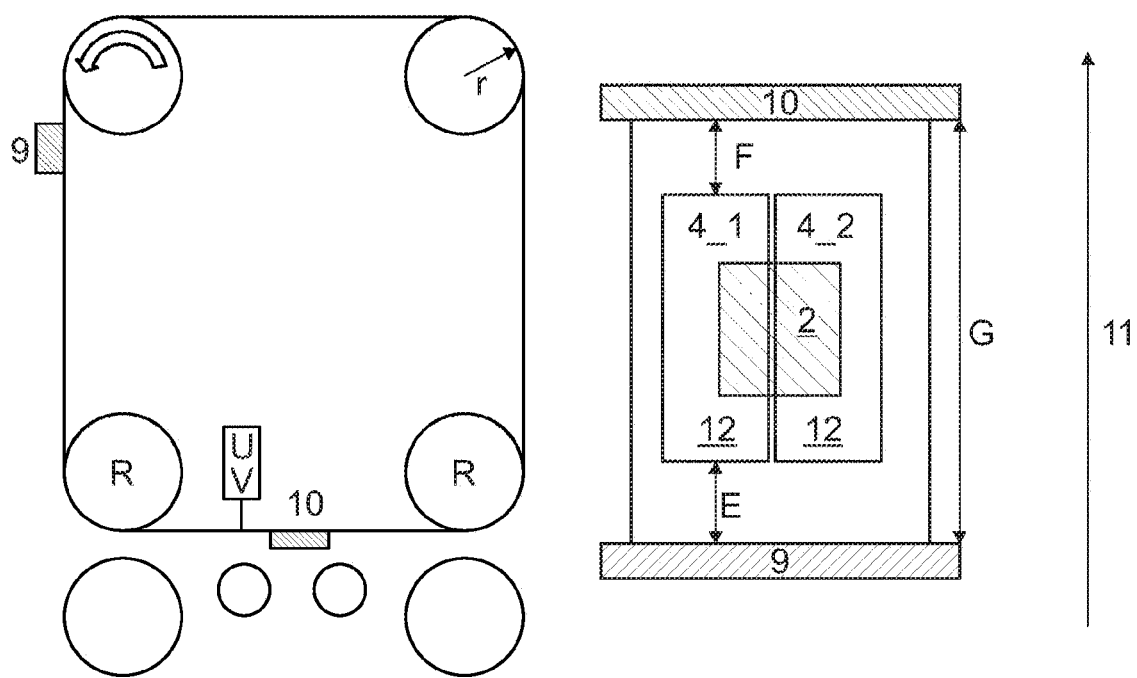
FIG. 7 shows schematically a variation of a flexible stamp for the imprinting apparatus of FIG. 6.

In FIG. 7 a schematic view (and simplified representation) of an apparatus for an imprinting process with two strengthening layers 4_1 and 4_2 is shown, having active area 2 as well as non-active area 12.

The invention claimed is:

1. A flexible stamp comprising:
at least one strengthening layer and at least one texturing layer with a relief area, wherein at least one part of the at least one strengthening layer is positioned below the at least one texturing layer and supports the relief area and the texturing layer at least partially, wherein the combination of the at least one part of the strengthening layer, the texturing layer and the relief area forms an active area,
a non-active area which comprises at least one further part of the at least one strengthening layer which is uncovered by the texturing layer and relief area or an at least one further strengthening layer which is uncovered by the texturing layer and relief area wherein each strengthening layer has a thermal expansion coefficient of 10 ppm/° C. or lower, a Young's modulus in the range of 10 GPa-200 GPa, and a layer thickness of below 300 μm, wherein the active area and the non-active area of the flexible stamp represent at least 90% of a total area of the flexible stamp, and wherein the at least one strengthening layer and/or the at least one further strengthening layer covers at least 90% of the total area of the flexible stamp;
wherein the at least one strengthening layer and/or the at least one further strengthening layer is positioned above and in contact with a base layer, and
wherein the at least one strengthening layer and/or the at least one further strengthening layer is made of a plurality of strengthening tiles, wherein different strengthening tiles are positioned on and in contact with the base layer with a seam between the strengthening tiles.

2. The flexible stamp according to claim 1, wherein the seam between different strengthening layers arranged next to each other or between different neighboring tiles or between a strengthening layer and strengthening tiles is below 2 mm.

3. The flexible stamp according to claim 1, wherein the seam between different strengthening layers arranged next to each other or between different neighboring tiles or between a strengthening layer and strengthening tiles is below 500 μm.

4. The flexible stamp according to claim 1, wherein the at least one strengthening layer and/or the at least one further strengthening layer has a width below 1.3 m and a length below 2.50 m.

5. The flexible stamp according to claim 1, wherein the flexible stamp has a frame area, which is strengthening layer free.

6. The flexible stamp according to claim 1, wherein the flexible stamp comprises a top layer, whereby the top layer is positioned above the at least one strengthening layer.

7. The flexible stamp according to claim 6, wherein the texturing layer is part of the top layer, or the texturing layer is on top of the top layer.

8. The flexible stamp according to claim 7, wherein the top layer and/or the base layer are/is made of foil and/or cured resin, wherein the top layer and the base layer have the same or different sizes and/or the top layer is made of the same or different material than the base layer.

9. The flexible stamp according to claim 1, wherein the flexible stamp comprises two or more texturing layers with two or more relief areas.

10. The flexible stamp according to claim 7, wherein the top layer and/or the base layer have a thickness of 25 to 500 µm.

11. The flexible stamp according to claim 1, wherein the at least one strengthening layer and/or the at least one further strengthening layer is shielded by at least one layer selected from a group consisting of: the at least one texturing layer, the base layer and one or more further layers.

12. The flexible stamp according to claim 1, wherein each texturing layer with relief area in combination with a strengthening layer form a master unit, wherein adjoining edges of neighboring master units are parallel with each other and wherein the master units arranged such that splice lines between the master units only have junctions between master units where at most three corners of neighboring master units are brought together.

13. The flexible stamp according to claim 12, wherein the master units are arranged in rows perpendicular to a length direction of the base layer, wherein the master units of one row have an offset from the master units of the neighboring row.

14. The flexible stamp according to claim 1, wherein the flexible stamp comprises an external frame area, wherein the external frame area is reversibly connected via a connector on the flexible stamp.

15. An imprinting apparatus comprising a flexible stamp according to claim 1, and rollers with a radius r, wherein the rollers guide the flexible stamp, which has a length E that starts from a beginning of a first active area in opposite direction of an imprinting direction and ends on a first clamp and a second length F that starts at an end of a last active area in the imprinting direction and ends at a second clamp in the imprinting direction and satisfying the following formula:

$$L = \frac{1}{4} 2 * \pi * r$$

wherein L is either the first length E or the second length F.

* * * * *